(12) United States Patent
Zhou et al.

(10) Patent No.: US 10,679,901 B2
(45) Date of Patent: Jun. 9, 2020

(54) DIFFERING DEVICE CHARACTERISTICS ON A SINGLE WAFER BY SELECTIVE ETCH

(71) Applicant: INTERNATIONAL BUSINESS MACHINES CORPORATION, Armonk, NY (US)

(72) Inventors: Huimei Zhou, Albany, NY (US); Shogo Mochizuki, Clifton Park, NY (US); Gen Tsutsui, Glenmont, NY (US); Ruqiang Bao, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/103,433

(22) Filed: Aug. 14, 2018

(65) Prior Publication Data

US 2020/0058555 A1    Feb. 20, 2020

(51) Int. Cl.
*H01L 21/8234*    (2006.01)
*H01L 27/088*    (2006.01)
*H01L 21/02*    (2006.01)
*H01L 21/306*    (2006.01)
*H01L 21/311*    (2006.01)

(52) U.S. Cl.
CPC .. *H01L 21/823431* (2013.01); *H01L 21/0228* (2013.01); *H01L 21/02266* (2013.01); *H01L 21/30608* (2013.01); *H01L 21/31111* (2013.01); *H01L 27/0886* (2013.01)

(58) Field of Classification Search
CPC .......... H01L 21/02266; H01L 21/0228; H01L 21/30608; H01L 21/31111; H01L 21/823431; H01L 27/0886
See application file for complete search history.

(56) References Cited

U.S. PATENT DOCUMENTS 7,964,865 B2    6/2011    Chidambarrao et al.
8,941,153 B2    1/2015    Lee et al.
(Continued)

FOREIGN PATENT DOCUMENTS

WO    WO-2017099220 A1 *    6/2017    ........... H01L 29/513

OTHER PUBLICATIONS

Anonymous, FinFETs with multiple fin heights, An IP.com Prior Art Database Technical Disclosure, IP.com No. IPCOM000235771D, Mar. 25, 2014.

*Primary Examiner* — Allan R Wilson
(74) *Attorney, Agent, or Firm* — Tutunjian & Bitetto, P.C.; Vazken Alexanian

(57) ABSTRACT

Integrated chips and methods of forming the same include etching a first stack of layers in a first region and etching a second stack of layers in a second region. The first stack of layers includes a first semiconductor layer having a first thickness over a first sacrificial layer having a second thickness. Etching the first stack of layers removes the first sacrificial layer from the first stack of layers and creates a first gap. The second stack of layers includes a second semiconductor layer having a third thickness over a second sacrificial layer having a fourth thickness. Etching the second stack of layers removes the second sacrificial layer from the second stack of layers and to create a second gap. A dielectric material fills the first gap and the second gap.

20 Claims, 6 Drawing Sheets

(56) References Cited

U.S. PATENT DOCUMENTS

| | | | |
|---|---|---|---|
| 8,969,149 B2 * | 3/2015 | Leobandung | H01L 29/78609 |
| | | | 257/18 |
| 9,362,178 B1 | 6/2016 | Cao et al. | |
| 9,515,090 B2 | 12/2016 | Caimi et al. | |
| 9,520,330 B2 | 12/2016 | Andrieu et al. | |
| 9,530,699 B2 | 12/2016 | Kerber et al. | |
| 9,627,273 B2 | 4/2017 | Kim | |
| 9,818,874 B2 | 11/2017 | Nguyen et al. | |
| 9,865,681 B1 * | 1/2018 | Wu | H01L 29/0673 |
| 10,026,652 B2 * | 7/2018 | Wang | H01L 21/02532 |
| 10,490,564 B2 * | 11/2019 | Mushiga | H01L 27/1157 |
| 2008/0128797 A1 | 6/2008 | Dyer et al. | |
| 2014/0199815 A1 * | 7/2014 | Hwang | H01L 29/66833 |
| | | | 438/270 |
| 2014/0339611 A1 * | 11/2014 | Leobandung | H01L 29/78609 |
| | | | 257/288 |
| 2016/0380104 A1 * | 12/2016 | Cohen | H01L 29/7856 |
| | | | 257/76 |
| 2018/0040730 A1 | 2/2018 | Lauer et al. | |
| 2018/0053690 A1 * | 2/2018 | Wang | H01L 29/0673 |
| 2018/0277555 A1 * | 9/2018 | Fukushima | H01L 27/11556 |
| 2018/0294279 A1 * | 10/2018 | Sawabe | H01L 29/40117 |

* cited by examiner

DIFFERING DEVICE CHARACTERISTICS ON A SINGLE WAFER BY SELECTIVE ETCH

BACKGROUND

Technical Field

The present invention generally relates to semiconductor fabrication and, more particularly, to the efficient fabrication of semiconductor devices having different properties on a shared wafer.

Description of the Related Art

There are many ways to achieve different device properties in a given semiconductor device. For example, different semiconductor materials may be used, implants may be used, layer thicknesses may be tuned, different work function metals may be used, etc. Devices may thereby be tuned to adjust characteristics such as, e.g., threshold voltage and current carrying capacity.

However, the fabrication of substantially different device designs on a given wafer can cause a significant increase in the number of fabrication steps that are needed, as different materials and different device dimensions can necessitate different masking/etching phases. The more fabrication steps that are needed to create a given device, the higher the cost of production.

SUMMARY

A method of forming an integrated chip includes etching a first stack of layers in a first region and etching a second stack of layers in a second region. The first stack of layers includes a first semiconductor layer having a first thickness over a first sacrificial layer having a second thickness. Etching the first stack of layers removes the first sacrificial layer from the first stack of layers and creates a first gap. The second stack of layers includes a second semiconductor layer having a third thickness over a second sacrificial layer having a fourth thickness. Etching the second stack of layers removes the second sacrificial layer from the second stack of layers and to create a second gap. A dielectric material fills the first gap and the second gap.

A semiconductor device includes a substrate layer. A semiconductor fin is formed over the substrate fin. A dielectric layer fills a gap between the semiconductor fin and the substrate, on end faces of the semiconductor fin, and on a top surface of the semiconductor fin.

An integrated chip includes a substrate layer, a first device, and a second device. The first device includes a first semiconductor fin formed over the substrate, having a first thickness, and a first dielectric layer filling a gap between the first semiconductor fin and the substrate, on end faces of the first semiconductor fin, and on a top surface of the first semiconductor fin. The second device includes a second semiconductor fin, formed over the substrate, having a second thickness that is different from the first thickness, and a second dielectric layer filling a gap between the first semiconductor fin and the substrate, on end faces of the first semiconductor fin, and on a top surface of the first semiconductor fin.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention fabricate semiconductor devices that vary device characteristics by forming multi-layer channel regions, with the relative thicknesses of the different layers provide different properties for the respective device by tuning intra-layer stresses and fin height. In some embodiments, the fins are formed with a silicon base, a high germanium concentration silicon germanium layer, and a low germanium concentration silicon germanium layer, with one of the two silicon germanium layers being selectively etched away and replaced by, e.g., a dielectric material.

Figure 1:
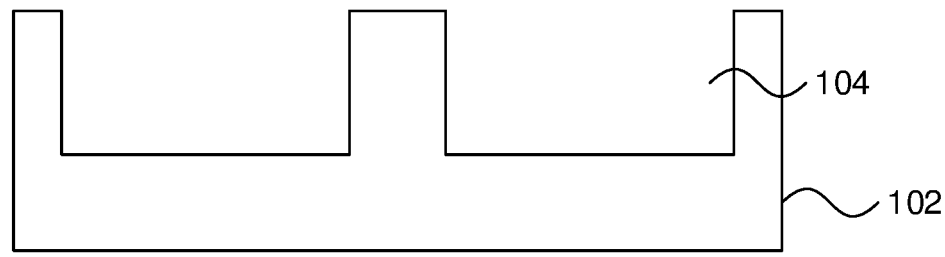
FIG. 1 is a cross-sectional diagram of a step in the fabrication of semiconductor devices having different properties that shows the formation of trenches in a substrate in accordance with embodiments of the present invention.

Referring now to FIG. 1, a step in the fabrication of an integrated chip is shown. A substrate 102 is provided. The semiconductor substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 102 may also be a semiconductor on insulator (SOI) substrate.

Although it is specifically contemplated that the substrate 102 may be a semiconductor substrate, for compatibility with existing processes, it should be understood that nothing in the present embodiments relies on semiconducting properties in the substrate 102. As a result, the substrate 102 may be formed from dielectric materials instead of semiconductor materials.

Trenches 104 are formed in the substrate 102. These trenches 104 may be formed by masking the surface of the substrate 102 and using a timed anisotropic etch to remove substrate material in unmasked regions. The anisotropic etch may include reactive ion etching (RIE), which is a form of plasma etching in which the surface to be etched is placed on a radio-frequency powered electrode. During RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

Figure 2:
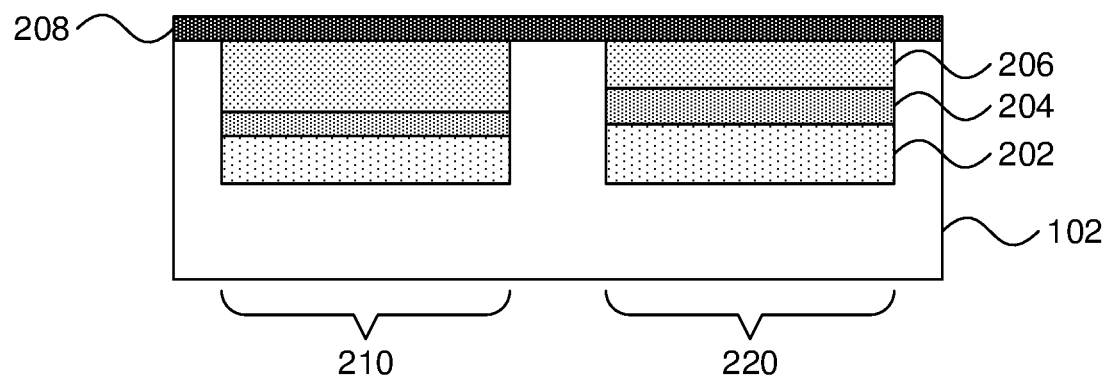
FIG. 2 is a cross-sectional diagram of a step in the fabrication of semiconductor devices having different properties that shows the formation of stacks of layers in the trenches, the stacks having being made up of layers having different thicknesses, in accordance with embodiments of the present invention.

Referring now to FIG. 2, a step in the fabrication of a first embodiment of an integrated chip is shown. In this embodiment, different levels of stress will be induced in a channel layer by varying the relative thicknesses of two different semiconductor materials. Thus a layer of sacrificial material 202, a first semiconductor layer 204, and a second semiconductor layer 206 are formed in the trenches 104. The integrated chip is shown as including two regions, a first region 210 and a second region 220, each with different relative thicknesses of the sacrificial layer 202, the first semiconductor layer 204, and the second semiconductor layer 206. Although the regions 210 and 220 are shown as being in close proximity to one another in the integrated chip, it should be understood that this closeness is solely for ease of illustration and that the regions 210 and 220 may have any position with respect to one another, varying in distance and/or orientation.

In one specific embodiment, it is contemplated that the sacrificial layer 202 may be formed from silicon germanium having a low germanium concentration, the first semiconductor layer 204 may be formed from silicon, and the second semiconductor layer 206 may be formed from silicon germanium having a high germanium concentration. These particular materials are discussed herein because of the compatibility of their respective crystalline structures. Specifically, silicon, germanium, and silicon germanium with varying germanium concentrations have similar crystalline structures with slightly different spacing between the component atoms. This relationship between the materials makes it possible to epitaxially grow a layer of one material directly on a surface of another material, providing a single crystal with multiple layers.

The terms "epitaxial growth" and "epitaxial deposition" refer to the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

Crystalline orientation refers to the ordered arrangement atoms in a particular crystal structure along a given surface. In one example, silicon forms a "face-centered diamond-cubic" crystal structure, and cutting a silicon crystal along different planes will result in differing patterns of atoms being presented along the surface that is produced. These patterns are identified with Miller indices (e.g., <100>, <111>, etc), with different Miller indices corresponding to different crystalline orientations. Different crystalline orientations will have different properties during certain processes, such as etches and epitaxial growth.

A result of the different spacing between the atoms of different materials in such a crystal is that the materials will experience stress at their interfaces. In particular, a thick layer of silicon will cause a relatively thin layer of silicon germanium to be under stress as the atoms of the silicon germanium layer conform to the crystalline structure of the thick silicon layer. Conversely, a thick layer of silicon germanium will experience relatively little stress at an interface with a relatively thin layer of silicon, as its internal structure will be closer to its natural state. Different levels of strain in a silicon germanium layer will produce different electronic properties in a transistor device by, for example, changing the threshold voltage of the transistor.

The materials in question are also selectively etchable. As used herein, the term "selective" in reference to a material removal process denotes that the rate of material removal for a first material is greater than the rate of removal for at least another material of the structure to which the material removal process is being applied. Thus, individual layers can be selectively removed without substantially damaging the other layers.

In view of the above, it should be understood that other materials may be used instead of the recited silicon and silicon germanium. It is specifically contemplated that, for example, germanium may be substituted for one or more of the layers in question. It should also be understood that any other set of materials may be used instead if they have compatible crystalline structures yet have appropriate etch selectivity. Furthermore, while the layers are depicted as being formed from consistent materials between the different device regions, they may instead be formed from different materials. For example, the sacrificial layer may be formed from a first sacrificial material in the first region 210 and from a second sacrificial material in the second region 220, and the same goes for the semiconductor layers, as long as the layers of a given region have the appropriate properties.

The different thicknesses of the layers shown in FIG. 2 may be accomplished by masking, for example, region 210 while the layers are grown in region 220. Thickness can be controlled by controlling a duration of the epitaxial growth process. After growing the layers in region 220, the mask in region 210 may be removed. Region 220 may then be masked while layers are grown in region 210. The order in which the regions are masked may naturally be reversed as well.

In some embodiments, the total thickness of the layers 202, 204, and 206 is in a range between about 40 nm and about 80 nm. The thickness of the layer of sacrificial material 202 may be between about 1 nm and about 30 nm. The thickness of the first semiconductor layer 204 may be between about 1 nm and about 50 nm. The thickness of the second semiconductor layer 206 may be between about 1 nm and about 50 nm. In each case, the thickness of the layers can be controlled by parameters of the epitaxial growth process including, for example, time, pressure, temperature, and gas used. The properties of the final device, including device performance and threshold voltage, are determined by the mobility of the concentration ratio, lattice mismatch ratio, and thickness ratio of the semiconductor layers 204 and 206.

After formation of the sacrificial layers 202, the first semiconductor layers 204, and the second semiconductor layers 206 in regions 210 and 220, a hardmask 208 is formed over top of both regions. The hardmask 208 may be formed from any appropriate dielectric material including, for example, silicon nitride, and may be formed by any appropriate deposition process, including, for example, chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Figure 3:
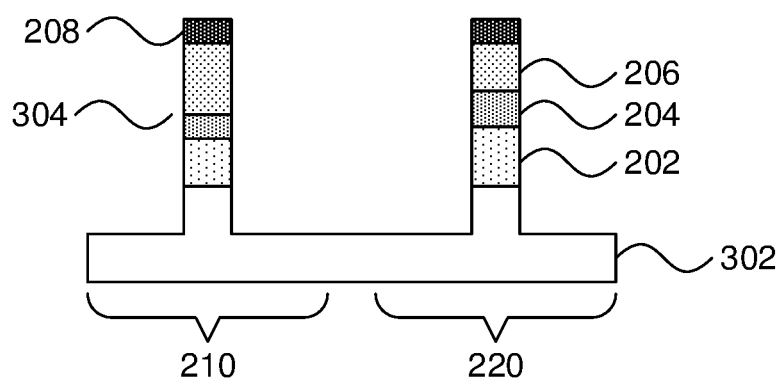
FIG. 3 is a cross-sectional diagram of a step in the fabrication of semiconductor devices having different properties that shows the formation of fins from the stacks of layers in accordance with embodiments of the present invention.

Referring now to FIG. 3, a step in the fabrication of a first embodiment of an integrated chip is shown. This view is shown in a cross-section that is made across the fins. Masking and an anisotropic etch is used to form fins 304 in the first region 210 and the second region 220. It should be understood that other processes, such as a sidewall image transfer process, may be used to form these fins 304. The etch cuts down into the substrate 102, to form etched substrate 302, which has at least a portion of substrate material supporting the fins 304 in areas under the fins 304.

It should be noted that, after this etch, the fins may 304 be of any arbitrary length (referring to the dimension perpendicular to the illustrated cross-section). The fins 304 may be long enough to accommodate any appropriate number of devices having the respective device characteristics.

Figure 4:
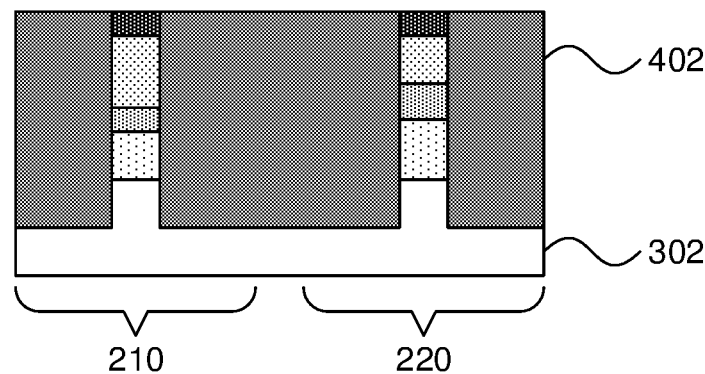
FIG. 4 is a cross-sectional diagram of a step in the fabrication of semiconductor devices having different properties that shows the formation of a passivating layer around the fins in accordance with embodiments of the present invention.

Referring now to FIG. 4, a step in the fabrication of a first embodiment of an integrated chip is shown. This view is shown in a cross-section that is made across the fins. A layer of passivating material 402 is deposited around the fins. It is specifically contemplated that this passivating material may include silicon dioxide, but any other appropriate electrical insulator may be used instead. The passivating material may be deposited using any appropriate deposition method including, e.g., CVD, ALD, PVD, or GCIB deposition, with a spin-on flowable CVD process being specifically contemplated. The material may be filled in to any height above a top height of the hardmask layer 208 and then polished down to a same height of the hardmask layer using, e.g., a chemical mechanical planarization (CMP) process. CMP is performed using, e.g., a chemical or granular slurry and mechanical force to gradually remove upper layers of the device. The slurry may be formulated to be unable to dissolve, for example, the hardmask, resulting in the CMP process's inability to proceed any farther than that layer.

Figure 5:
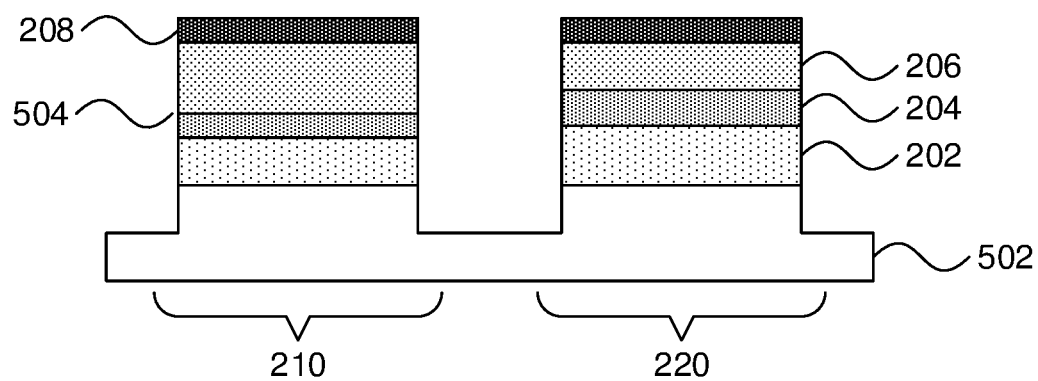
FIG. 5 is a cross-sectional diagram of a step in the fabrication of semiconductor devices having different properties that shows the etching of ends of the fins in accordance with embodiments of the present invention.

Referring now to FIG. 5, a step in the fabrication of a first embodiment of an integrated chip is shown. This view is shown in a cross-section that is made parallel to the fins. A fin cut is performed using an anisotropic etch that cuts each of the fins 304 into one or more fins 504, additionally cutting down into the substrate to form etched substrate 502. It should be understood that each of region 210 and 220 may have any number of such fins as a result of the fin cut process. The fin cut leaves ends of the fins 504 exposed, while the sidewalls (not shown in this figure) are still covered and supported by the passivating layer 402.

Figure 6:
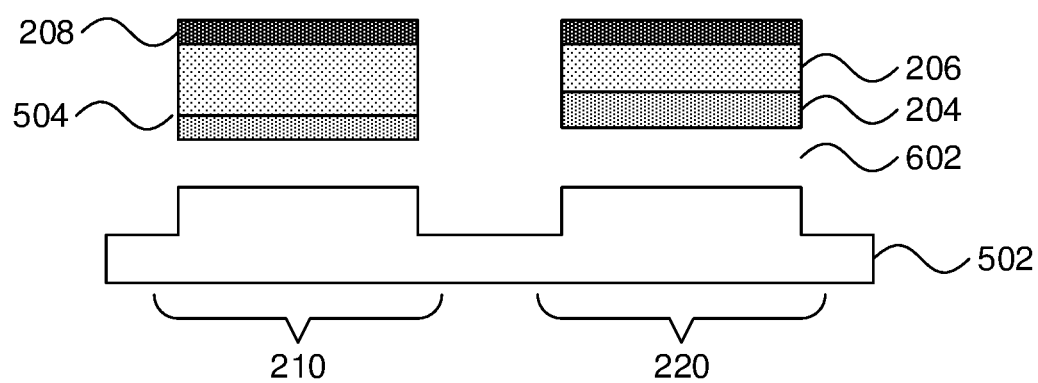
FIG. 6 is a cross-sectional diagram of a step in the fabrication of semiconductor devices having different properties that shows the removal of a sacrificial layer from each of the stacks of layers in accordance with embodiments of the present invention.

Referring now to FIG. 6, a step in the fabrication of a first embodiment of an integrated chip is shown. This view is shown in a cross-section that is made parallel to the fins. A selective isotropic etch is performed that selectively removes the sacrificial layer 202. The remaining first semiconductor layer 204 and second semiconductor layer 206, which are not harmed by the etch, remain suspended by the passivating layer 402, leaving gaps 602 in the fins 504. The etch enters the fins 502 from the fin ends, removing material from within the structure. The etch may therefore be an appropriate wet or dry chemical etch that surrounds the fins 504 with etchant.

Figure 7:
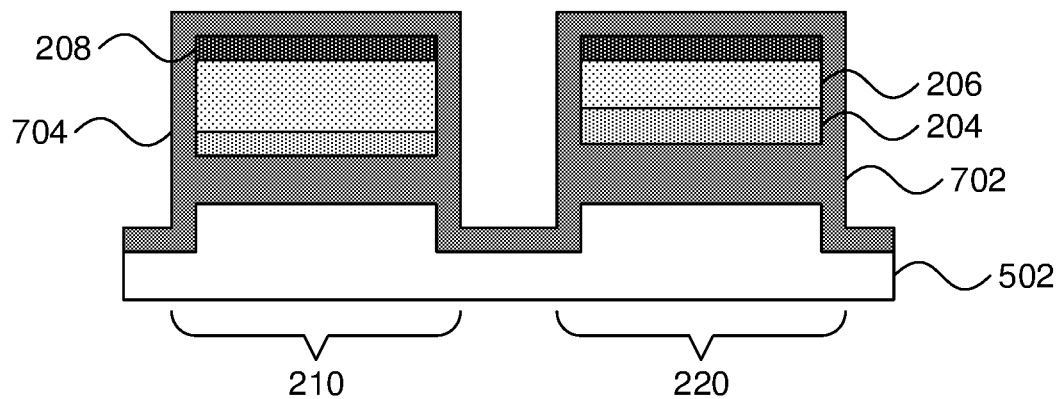
FIG. 7 is a cross-sectional diagram of a step in the fabrication of semiconductor devices having different properties that shows the formation of a dielectric layer in a gap between the remaining layers and the substrate in accordance with embodiments of the present invention.

Referring now to FIG. 7, a step in the fabrication of a first embodiment of an integrated chip is shown. This view is shown in a cross-section that is made parallel to the fins. A layer of dielectric material 702 is conformally deposited on the exposed surfaces of the fins 504, filling in the gaps 602. It is specifically contemplated that this dielectric material may include silicon dioxide, but it should be understood that any appropriate dielectric material may be used instead. It is specifically contemplated that ALD may be used to deposit the dielectric layer 702, but it should be understood that any conformal deposition process may be used instead.

The resulting fins 704 include channel regions that are formed from the first semiconductor layer 204 and the second semiconductor layer 206 at different thicknesses in each of the device regions 210 and 220. These different thicknesses, in particular the relative thicknesses of the two different semiconductor materials and the particular stresses that result from small differences in crystalline structure, produce different device properties.

The device may subsequently be finished by providing source/drain regions and gate structures, with at least a portion of the fins 704 remaining underneath the gate structures to act as channels. The fins 704 may thus form the basis for the fabrication of a fin field effect transistor (FinFET).

Figure 8:
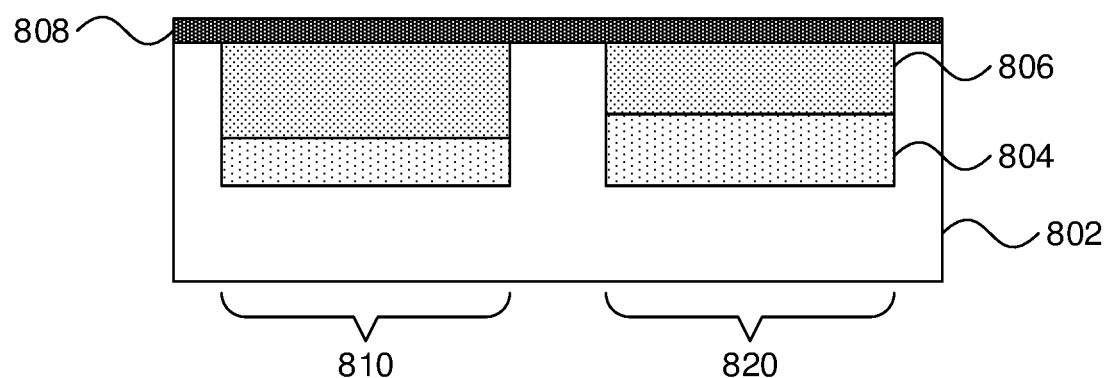
FIG. 8 is a cross-sectional diagram of a step in the fabrication of semiconductor devices having different properties that shows the formation of stacks of layers in the trenches in accordance with embodiments of the present invention.

Referring now to FIG. 8, a step in the fabrication of a second embodiment of an integrated chip is shown. This view is shown in a cross-section that is made parallel to the fins. In this embodiment, trenches are formed in a substrate 802 and filled a first region 810 and a second region 820 by a sacrificial layer 804 and a semiconductor layer 806. The two layers are formed at different relative thicknesses in each of the respective device regions. A hardmask layer 808 is formed over the device regions 810 and 820 as described above.

In some embodiments, the total thickness of layers 804 and 806 is in a range between about 40 nm and about 80 nm. The thickness of the sacrificial layer 804 may be between about 1 nm and about 50 nm. The thickness of the semiconductor layer 806 may be between about 1 nm and about 50 nm. In each case, the thickness of the layers can be controlled by parameters of the epitaxial growth process including, for example, time, pressure, temperature, and gas used. The properties of the final device, including device current capacity, are determined by such characteristics as the thickness of the semiconductor layer 806.

Figure 9:
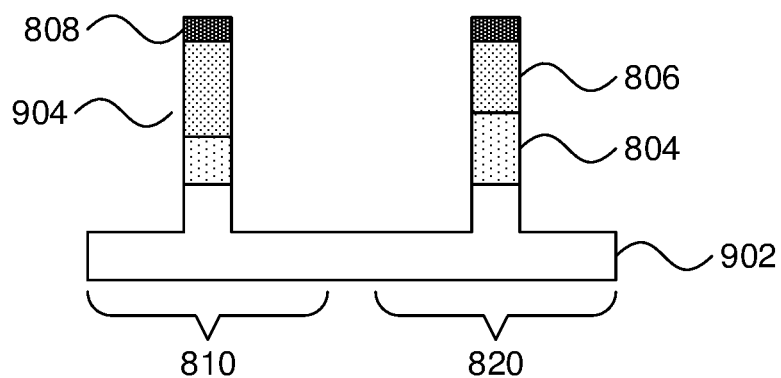
FIG. 9 is a cross-sectional diagram of a step in the fabrication of semiconductor devices having different properties that shows the formation of fins from the stacks of layers in accordance with embodiments of the present invention.

Referring now to FIG. 9, a step in the fabrication of a first embodiment of an integrated chip is shown. This view is shown in a cross-section that is made across the fins. An anisotropic etch is used to release the fins 904, etching down into the substrate 802 to leave etched substrate 902.

Figure 10:
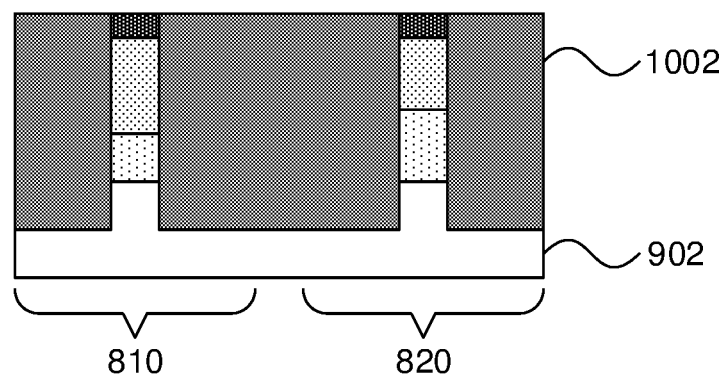
FIG. 10 is a cross-sectional diagram of a step in the fabrication of semiconductor devices having different properties that shows the formation of a passivating layer around the fins in accordance with embodiments of the present invention.

Referring now to FIG. 10, a step in the fabrication of a first embodiment of an integrated chip is shown. This view is shown in a cross-section that is made across the fins. A layer of passivating material 1002 is deposited around the fins 904 as described above, for example depositing silicon dioxide with a flowable CVD process and then polishing the material down to the height of hardmask layer 808.

Figure 11:
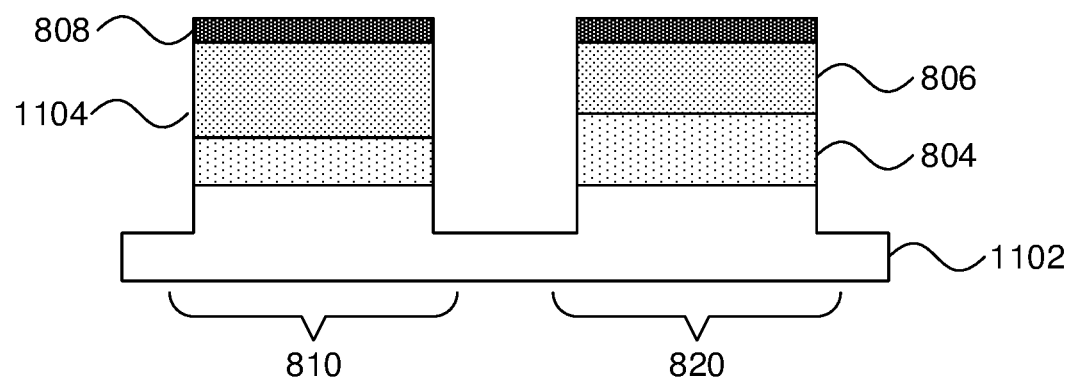
FIG. 11 is a cross-sectional diagram of a step in the fabrication of semiconductor devices having different properties that shows the etching of ends of the fins in accordance with embodiments of the present invention.

Referring now to FIG. 11, a step in the fabrication of a second embodiment of an integrated chip is shown. This view is shown in a cross-section that is made parallel to the fins. A fin cut process is performed as described above, with the long fins 904 being cut into one or more fins 1104 in an anisotropic etch. It should be understood that each of region 810 and 820 may have any number of such fins 1104 as a result of the fin cut process. The fin cut leaves ends of the fins 1104 exposed, while the sidewalls (not shown in this figure) are still covered and supported by the passivating layer 1002.

Figure 12:
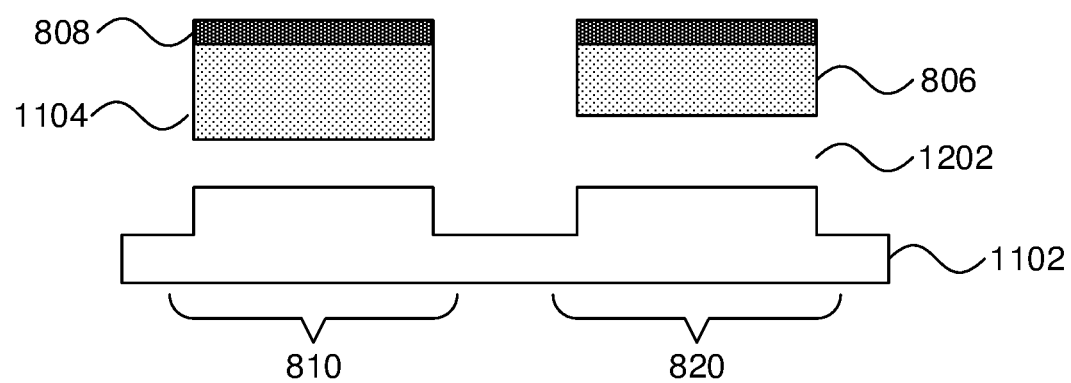
FIG. 12 is a cross-sectional diagram of a step in the fabrication of semiconductor devices having different properties that shows the removal of a sacrificial layer from each of the stacks of layers in accordance with embodiments of the present invention.

Referring now to FIG. 12, a step in the fabrication of a second embodiment of an integrated chip is shown. This view is shown in a cross-section that is made parallel to the fins. A selective isotropic etch is performed that selectively removes the sacrificial layer 202. The remaining semiconductor 806, which is not harmed by the etch, remains suspended by the passivating layer 1002, leaving gaps 1202 in the fins 1104. The etch enters the fins 1104 from the fin ends, removing material from within the structure. The etch may therefore be an appropriate wet or dry chemical etch that surrounds the fins 1104 with etchant.

Figure 13:
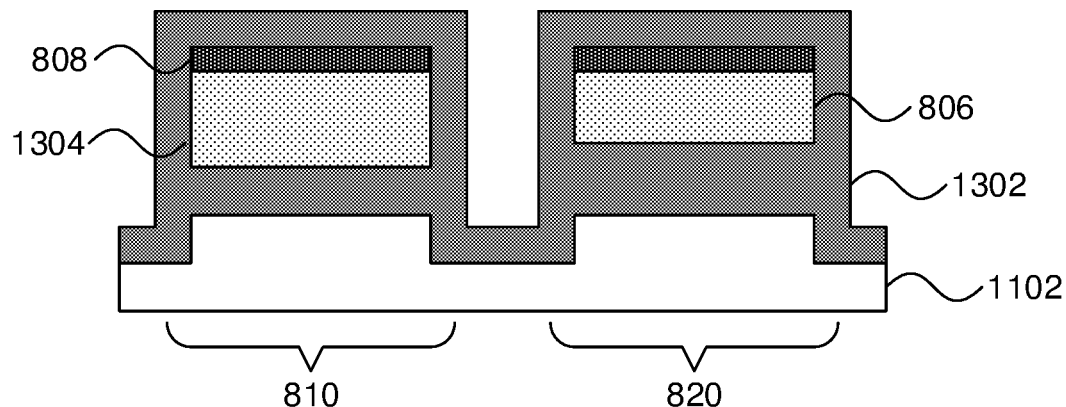
FIG. 13 is a cross-sectional diagram of a step in the fabrication of semiconductor devices having different properties that shows the formation of a dielectric layer in a gap between the remaining layers and the substrate in accordance with embodiments of the present invention.

Referring now to FIG. 13, a step in the fabrication of a first embodiment of an integrated chip is shown. This view is shown in a cross-section that is made parallel to the fins. A layer of dielectric material 1302 is conformally deposited on the exposed surfaces of the fins 1104, filling in the gaps 1202. It is specifically contemplated that this dielectric material may include silicon dioxide, but it should be understood that any appropriate dielectric material may be used instead. It is specifically contemplated that ALD may be used to deposit the dielectric layer 1302, but it should be understood that any conformal deposition process may be used instead. The resulting fins 1304 include channel regions that are formed from the semiconductor layer 806 at different thicknesses in each of the device regions 810 and 820. These different thicknesses produce different device properties.

The device may subsequently be finished by providing source/drain regions and gate structures, with at least a portion of the fins 1304 remaining underneath the gate structures to act as channels. The fins 1304 may thus form the basis for the fabrication of a fin field effect transistor (FinFET).

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 14:
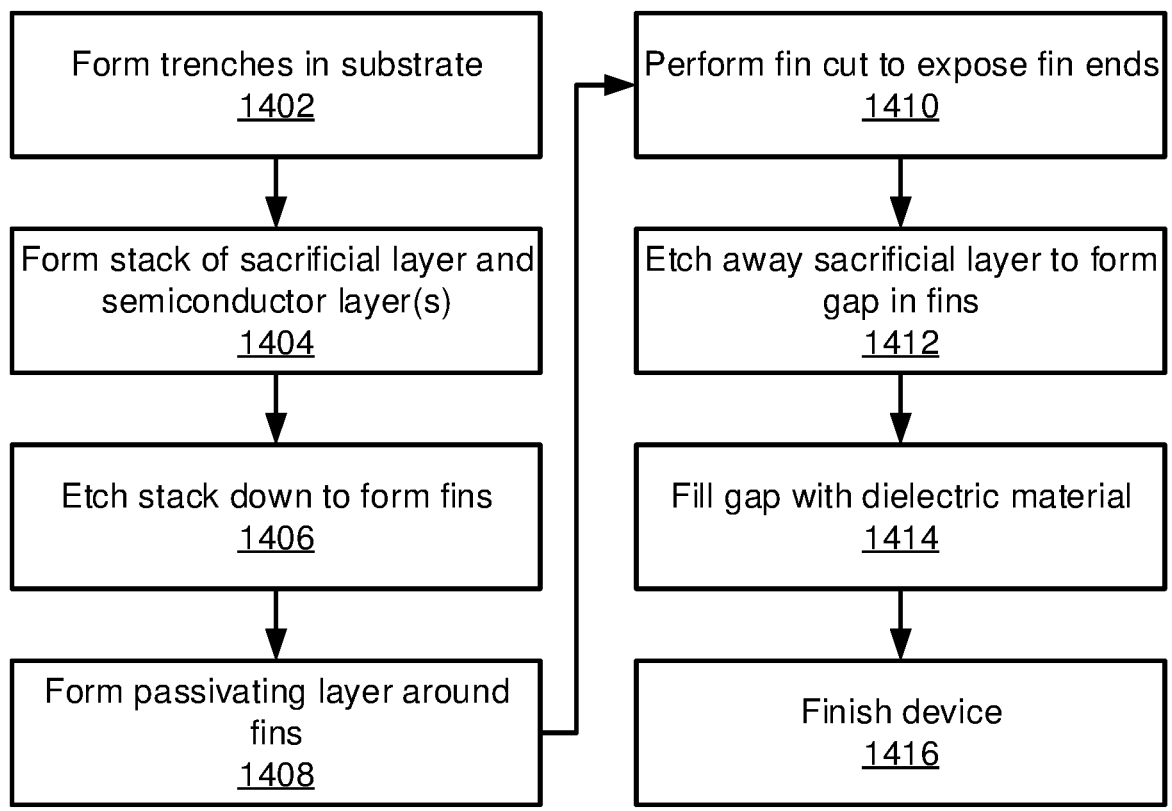
FIG. 14 is a block/flow diagram of a method of forming an integrated chip with devices having different properties in accordance with embodiments of the present invention.

Referring now to FIG. 14, a method for forming an integrated chip is shown. Block 1402 forms trenches in a substrate using an appropriate anisotropic etch. Block 1404 forms a stack in the trenches that includes a sacrificial layer and at least one semiconductor layer. As described above, the relative thicknesses of the sacrificial layer and the at least one semiconductor layer may very between regions of the substrate, resulting in finished devices in different regions that exhibit different properties. In one example, a relative thickness of two different semiconductor layers determines a level of stress in the channel of a finished device. In another example, a relative thickness of a sacrificial layer and a semiconductor layer determines a current capacity in the channel of a finished device.

Block 1406 uses an anisotropic etch to form fins in the first and second regions. Block 1408 then forms a passivating layer around the fins and block 1410 performs a fin cut to expose the ends of the fins. The fins remain supported by the surrounding passivating material. Block 1412 then uses an isotropic etch to remove the sacrificial layer and to form a gap in each fin, with the size of the gap depending on the thickness of the layer of sacrificial material. Block 1414 fills the gap with dielectric material using an appropriate conformal deposition process. Block 1416 finishes the device by, e.g., forming source/drain regions and gate structures, using at least a portion of the resulting fin as a channel for the device.

Figure 15:
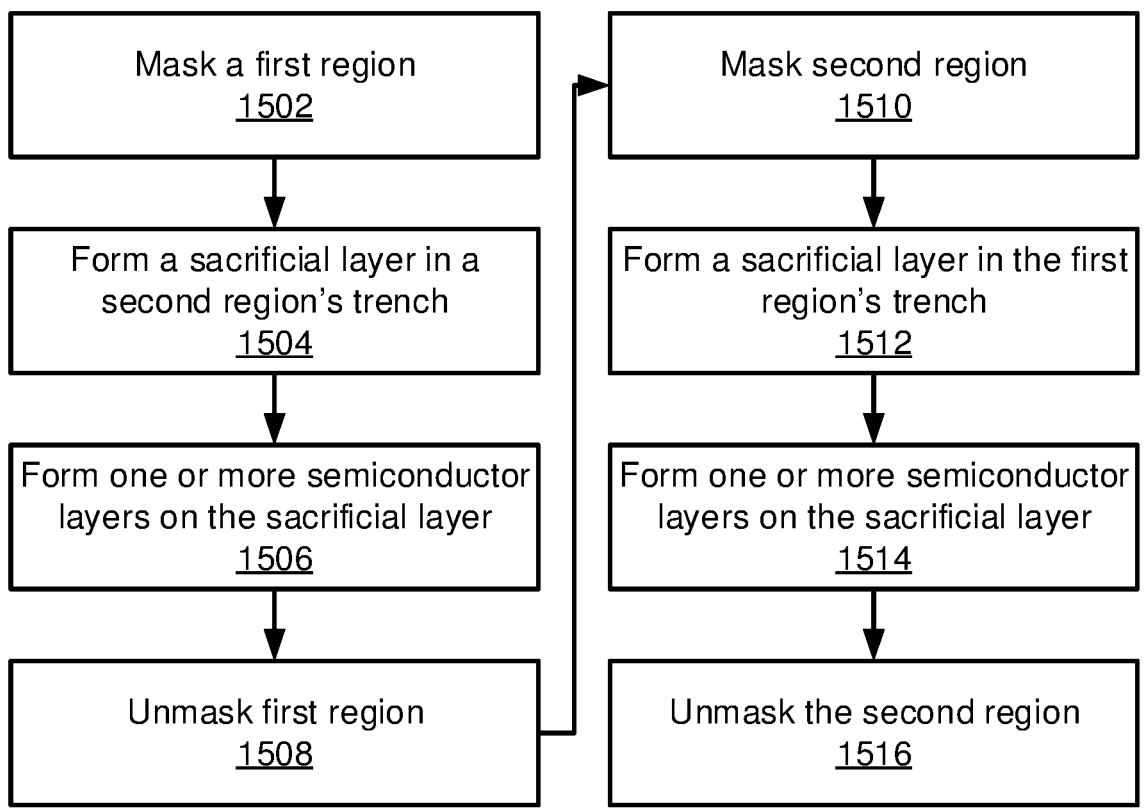
FIG. 15 is a block/flow diagram of a method of forming an integrated chip with devices having different properties in accordance with embodiments of the present invention.

Referring now to FIG. 15, additional detail on the formation of stacks of sacrificial and semiconductor layer(s) in block 1404 is shown. Block 1502 forms a mask in a first region using, for example, photolithographic patterning. Block 1504 then forms a sacrificial layer in the trench of a second region by, e.g., epitaxially growing the sacrificial layer from a bottom surface of the trench. Block 1506 forms one or more semiconductor layers on the sacrificial layer by, e.g., epitaxially growing such layers one after the other. The relative thicknesses of the sacrificial layer and the one or more semiconductor layers will determine the ultimate properties in devices formed in the second region. Block 1508 then unmasks the first region.

Block 1510 forms a mask in the second region using, for example, photolithographic patterning. Block 1512 then forms a sacrificial layer in the trench of a second region by, e.g., epitaxially growing the sacrificial layer from a bottom surface of the trench. Block 1514 forms one or more semiconductor layers on the sacrificial layer by, e.g., epitaxially growing such layers one after the other. The relative thicknesses of the sacrificial layer and the one or more semiconductor layers will determine the ultimate properties in devices formed in the second region. It should be understood that these relative thicknesses will differ by region, such that the resulting devices will have different properties from one another. Block 1516 then unmasks the second region.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming an integrated chip, comprising:
   etching a first stack of layers in a first region, the first stack of layers comprising a first semiconductor layer having a first thickness over a first sacrificial layer having a second thickness, to remove the first sacrificial layer from the first stack of layers and to create a first gap;
   etching a second stack of layers in a second region, the second stack of layers comprising a second semiconductor layer having a third thickness over a second sacrificial layer having a fourth thickness, different from the second thickness, to remove the second sacrificial layer from the second stack of layers and to create a second gap; and
   depositing a dielectric material that fills the first gap and the second gap.

2. The method of claim 1, wherein the first stack of layers further comprises a third semiconductor layer having a fifth thickness over the first semiconductor layer and the second stack of layers further comprises a fourth semiconductor layer having a sixth thickness over the second semiconductor layer.

3. The method of claim 2, wherein the first and second semiconductor layers are formed from a first semiconductor material having a first lattice constant and wherein the third and fourth semiconductor layers are formed from a second semiconductor material having a second lattice constant that is different from the first lattice constant.

4. The method of claim 1, further comprising forming a passivating layer around the first stack of layers and the second stack of layers before etching the first stack of layers and the second stack of layers.

5. The method of claim 4, further comprising performing a fin cut to expose ends of the first stack of layers and the second stack of layers after forming the passivating layer.

6. The method of claim 5, wherein depositing the dielectric material comprises a conformal deposition process that fills dielectric material in through the exposed ends of the first stack of layers and the second stack of layers.

7. The method of claim 5, wherein etching the first stack of layers and etching the second stack of layers each comprises an isotropic etch process that etches away sacrificial material through the exposed ends of the first stack of layers and the second stack of layers.

8. The method of claim 1, further comprising etching fins from the first stack of layers and the second stack of layers with an anisotropic etch that cuts partially into an underlying substrate.

9. The method of claim 1, further comprising forming the first stack of layers and the second stack of layers in respective trenches in a substrate by epitaxial growth.

10. The method of claim 9, wherein the first stack of layers has a same combined thickness as the second stack of layers.

11. A method of forming an integrated chip, comprising:
    forming, in a first trench in a first region, a first stack of layers that includes a first semiconductor layer having a first thickness over a first sacrificial layer having a second thickness;
    forming, in a second trench in a second region, a first stack of layers that includes a second semiconductor layer having a third thickness over a second sacrificial layer having a fourth thickness;
    etching the first stack of layers to remove the first sacrificial layer from the first stack of layers and to create a first gap;
    etching the second stack of layers to remove the second sacrificial layer from the second stack of layers and to create a second gap; and
    depositing a dielectric material that fills the first gap and the second gap.

12. The method of claim 11, wherein the first stack of layers further comprises a third semiconductor layer having a fifth thickness over the first semiconductor layer and the second stack of layers further comprises a fourth semiconductor layer having a sixth thickness over the second semiconductor layer.

13. The method of claim 12, wherein the first and second semiconductor layers are formed from a first semiconductor material having a first lattice constant and wherein the third and fourth semiconductor layers are formed from a second semiconductor material having a second lattice constant that is different from the first lattice constant.

14. The method of claim 11, further comprising etching fins from the first stack of layers and the second stack of layers with an anisotropic etch that cuts partially into an underlying substrate.

15. The method of claim 11, wherein the first stack of layers has a same combined thickness as the second stack of layers.

16. A method of forming an integrated chip, comprising:
    forming a passivating layer around a first stack of layers and a second stack of layers, wherein the first stack of layers includes a first semiconductor layer having a first thickness over a first sacrificial layer having a second thickness, and wherein the second stack of layers includes a second semiconductor layer having a third thickness over a second sacrificial layer having a fourth thickness;
    performing a fin cut to expose ends of the first stack of layers and the second stack of layers after forming the passivating layer;
    etching a first stack of layers in a first region, after forming the passivating layer, to remove the first sacrificial layer from the first stack of layers and to create a first gap;

etching a second stack of layers in a second region, after forming the passivating layer, to remove the second sacrificial layer from the second stack of layers and to create a second gap; and depositing a dielectric material that fills the first gap and the second gap.

17. The method of claim 15, wherein the first stack of layers further comprises a third semiconductor layer having a fifth thickness over the first semiconductor layer and the second stack of layers further comprises a fourth semiconductor layer having a sixth thickness over the second semiconductor layer.

18. The method of claim 15, wherein depositing the dielectric material comprises a conformal deposition process that fills dielectric material in through the exposed ends of the first stack of layers and the second stack of layers.

19. The method of claim 15, wherein etching the first stack of layers and etching the second stack of layers each comprises an isotropic etch process that etches away sacrificial material through the exposed ends of the first stack of layers and the second stack of layers.

20. The method of claim 15, further comprising etching fins from the first stack of layers and the second stack of layers with an anisotropic etch that cuts partially into an underlying substrate.

\* \* \* \* \*